United States Patent
Yan

Patent Number: 5,935,737
Date of Patent: Aug. 10, 1999

[54] METHOD FOR ELIMINATING FINAL EUV MASK REPAIRS IN THE REFLECTOR REGION

[75] Inventor: Pei-Yang Yan, Saratoga, Calif.

[73] Assignee: Intel Corporation, Santa Clara, Calif.

[21] Appl. No.: 08/996,358

[22] Filed: Dec. 22, 1997

[51] Int. Cl.$^6$ ....................................................... G03F 9/00
[52] U.S. Cl. ........................................................... 430/5
[58] Field of Search ............................... 430/5, 322, 323, 430/324

[56] References Cited

U.S. PATENT DOCUMENTS

| | | | |
|---|---|---|---|
| 5,272,024 | 12/1993 | Lin | 430/5 |
| 5,272,744 | 12/1993 | Itou et al. | 430/5 |
| 5,609,977 | 3/1997 | Iwamatsu et al. | 430/5 |

*Primary Examiner*—S. Rosasco
*Attorney, Agent, or Firm*—Naomi Obinata

[57] ABSTRACT

During the fabrication of a photolithography mask, double defect-absorbing layers are incorporated to ensure the final mask structure is free of defects. The process begins with a resonant reflector substrate. First and second defect-absorbing layers cover the substrate. The first and second defect-absorbing layers are selected to be repairable if defects form, as well as can be etched selectively relative to each other as well as to the underlying substrate. The first defect-absorbing layer is coated with photoresist. The photoresist is patterned using photolithography. Next, the photoresist pattern is transferred to the first defect-absorbing layer through plasma etching. Any defects arising from the etching step are repaired. Next, the pattern formed in the first defect-absorbing layer is transferred to the second defect-absorbing layer, using the first defect-absorbing layer as a mask. Any defects arising from the etching step are repaired. Next, an absorber layer is deposited into the etched open areas of the first and second defect-absorbing layers. The absorber layer is selected to be substantially absorptive to the wavelength of light to be used on the photolithography mask. The absorber layer is planarized, and then remaining defect-absorbing layers are removed. The remaining mask structure consists of the substrate with a patterned absorber layer.

19 Claims, 4 Drawing Sheets

METHOD FOR ELIMINATING FINAL EUV MASK REPAIRS IN THE REFLECTOR REGION

FIELD OF THE INVENTION

The present invention relates to the field of maskmaking for photolithography. More specifically, the invention discloses a method of fabricating masks to eliminate damage arising from repairing defects.

RELATED ART

Semiconductor mask fabrication for photolithography consists of a series of steps not unlike classic semiconductor integrated circuit fabrication. A film of absorber material is deposited on a substrate, then the absorber is covered with photoresist, the photoresist is patterned and the pattern is transferred to the absorber. The photoresist pattern is created initially by scanning the top surface of the photoresist with an electron beam controlled by a computerized database. The photoresist is then developed to rinse away unwanted portions. The film below the photoresist is etched to create a pattern in the film replicating the pattern in the photoresist. The photoresist is removed, and the mask is complete. When in use within a photolithography exposure system, photons from a light source at a specified wavelength impinge on the mask. The absorber portions absorb the light, and the other portions either transmit or reflect the light. The transmitted or reflected light reach a photoresist-covered silicon wafer, and the pattern from the mask is transferred into the photoresist on the silicon wafer.

The fabrication of photolithography masks inevitably includes issues with defects. Defect inspection and repair is therefore a necessary step in fabricating masks. Defects must be repaired because even very small defects on the mask can impair subsequent patterning of a silicon substrate during mask use. In defect inspection and repair, the partially fabricated mask is placed in a defect inspection tool. The defects are identified visually, by type and by location. An ion beam is used to either create patches in the structure or remove unwanted material, both situations arising from defects.

There are usually two types of defects. One is a known as a "clear" defect, the other is known as an "opaque" defect. Clear defects are due to an undesired pattern transfer into the underlying absorber film material. This can occur because of flaws in the initial photoresist patterning prior to pattern transfer to the absorber. If the photoresist is developed in an area where it is not supposed to be developed, then the unintended pattern will be transferred to the absorber below, resulting in an unwanted opening in the absorber structure.

Opaque defects appear either on the edges or within the opening of a pattern. Opaque defects are in a sense the opposite of clear defects. They form when excess mask material is present during the etch step, causing intrusions into the pattern opening. There are usually two causes of opaque defects. One is due to inadequate photoresist development at the pattern edges. Portions of photoresist which are supposed to be washed away remain at the pattern edges, and become small etch masks along the edges of the pattern, preventing a pattern from being fully opened in the absorber layer. An opaque defect can also occur when contamination particles fall into areas being etched. Contamination can fall into the area being etched anywhere, at the edge of the area or in the center. The contamination covers a portion of the underlying material being etched, becoming a mask. The effect is that of a micro-mask, where an unetched portion of absorber remains directly beneath the contamination.

Following inspection, the defects are repaired. Both clear and opaque defects are repairable. The repair is usually done by placing the mask into a focused-ion beam system, to expose the defect areas to a stream of gallium ions. The gallium creates patches, that is, fills in the defect, where the defect is a clear defect. In the case of opaque defects, the gallium simply etches them away to create a clean pattern opening in the absorber layer in accordance with the preselected, desired pattern dimensions.

While defect repair in it of itself has its obvious advantages, the repair process creates its own defects. A patch in an absorber to repair a clear defect is an improvement over not having a patch at all. But a patch itself has a shortcoming in that it spreads beyond the dimensions of the clear defect. The patch material spreads outside of the clear defect edges and out the bottom of the clear defect. This can create problems for controlling the edge dimensions of a pattern if a clear defect is near a pattern edge. With opaque defect repair, the end result is usually a remnant gallium "stain", arising from damage to the substrate that inevitably occurs from bombardment by a stream of energetic gallium ions. The damage spreads beyond the dimensions of the opaque defect, intruding into the underlying material. Because of the spreading effect of a "stain", the "stain" creates localized flaws in light transmission patterns when the mask is in use.

Any defect in the mask, even if due to remnants from defect repair, poses problems on using the mask for patterning semiconductor substrates. Especially as line widths become very small, on the order of 0.1 microns, repair "stain" remnants have an amplifying effect when transferred onto semiconductor wafers. It would be advantageous to have a mask fabrication process that can substantially eliminate defects in the mask.

SUMMARY

A method of fabricating a photolithography mask is disclosed. In one embodiment, there is a substrate coated with a first defect-absorbing layer and a second defect-absorbing layer. The first defect-absorbing layer is patterned. Then, defects that form in the patterned first defect-absorbing layer are repaired. The pattern of the first defect-absorbing layer is transferred into the second defect-absorbing layer, and any defects that form in the patterned second defect-absorbing layer are repaired. Absorbing structures are formed on the substrate within the openings in the pattern of the second defect-absorbing layer.

In an alternative embodiment, there is a substrate coated with a reflective material. The substrate is coated with two defect-absorbing layers. The first defect-absorbing layer is patterned, and defects from patterning the first defect-absorbing layer are repaired. The reflective material and the second defect-absorbing material are etched using the first defect-absorbing layer as a mask. The openings of the pattern in the etched reflective material are filled with a non-reflecting material. The top surface of the mask is planarized.

DESCRIPTION OF THE PREFERRED EMBODIMENTS

The invention discloses a novel method of fabricating a mask structure. While not limited to a particular application, the invention is particularly useful for Extreme Ultraviolet Lithography ("EUVL"). EUVL is photolithography conducted at wavelengths of between 5 and 25 nanometers, and is intended for use in chip fabrication where minimum line widths of 0.1 micron are needed. The mask is characterized by a substrate containing absorber regions thereon. The substrate is any substrate suitable for the type of photolithography wavelength regime to be used. For EUVL, the substrate is preferably a silicon wafer, selected for its shape and ease of using in process equipment normally used for semiconductor processing. The substrate contains a reflective coating.

The process for fabricating the mask is characterized by the use of a defect-absorbing film structure to absorb process defects and eliminate defect repair effects from the main portions of the mask. The defect-absorbing film structure is etched, and then the inevitably forming defects are repaired. Once repaired, the defect-absorbing film structure becomes a nearly ideal mask, and is used as a mask for subsequent processing steps. The invention is described in further detail below, in reference to the drawings.

Figure 1:
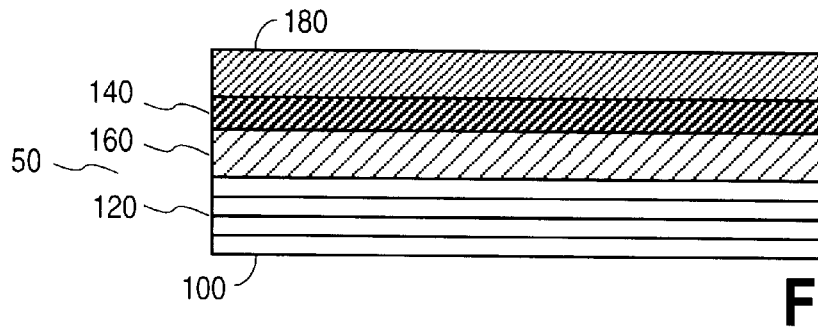
FIG. 1 represents a cross-sectional view of a starting mask substrate containing two layers of defect-absorbing film and a layer of photoresist.

FIG. 1 is an example of a starting structure of an EUVL mask 50. The mask contains a substrate 100 which includes a multilayer, resonant reflective coating 120. Resonant reflective coating 120 is preferably made of alternating thin layers of a reflective and transmissive material for a 5 to 25 nanometer wavelength EUVL range. Molybdenum and silicon as the reflective and transmissive materials, respectively, are examples of materials that can be used. The materials are applied thinly enough to create the effect of a resonant reflectance to incoming light. Generally, about 20 to 80 angstroms thickness per sheet, for a total of 40 to 120 sheets will create the resonant reflective effect especially at the preferred wavelength of approximately 13 nanometers. Resonant reflective coating 120 is overcoated with two layers of defect-absorbing material 140 and 160. The defect-absorbing material 140 and 160 can be any material that can withstand plasma etch processing and defect repairs. The first defect-absorbing layer 140 should be etchable in a gas plasma so that it can be etched cleanly with vertical sidewalls and the etch can be stopped on the second defect-absorbing layer 160. The thickness of first defect-absorbing layer 140 should be a minimal thickness necessary to serve as a mask for second defect-absorbing layer 160 in a plasma etch process. Second defect-absorbing layer 160 should also be etchable in a gas plasma so that it can be etched cleanly with minimum defects, vertical sidewalls and the etch can be stopped on the underlying resonant reflective coating 120. Second defect-absorbing layer 160 should be at least as thick as the desired thickness of a to-be-formed light absorber structure, which will be formed by filling openings created in second defect-absorbing layer 160. Examples of materials are silicon nitride for first defect-absorbing material 140 and silicon dioxide for second defect-absorbing material 160. These materials are preferred because they have known etch characteristics and tend to produce substantially vertical sidewalls when etched. First defect-absorbing material 140 is overcoated with photoresist 180.

Figure 2:
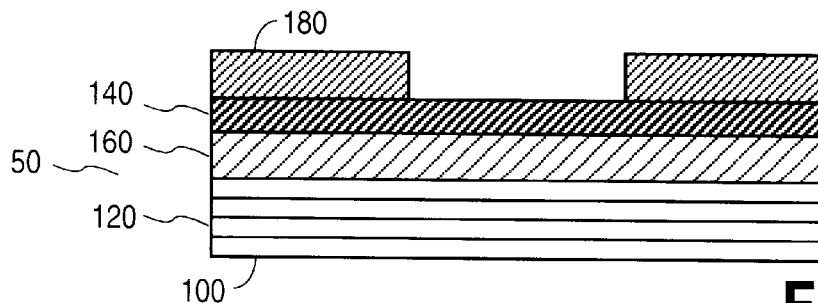
FIG. 2 represents a cross-sectional view of the mask of FIG. 1 after a pattern has been created in the photoresist.

FIG. 2 is a cross-sectional view of the result of the next step, which is to pattern the photoresist 180. Photoresist 180 is patterned preferably by first scanning the surface of photoresist 180 with an electron beam that is controlled by a computer database containing the desired pattern for an integrated circuit film layer. The electron beam "writes" the database pattern onto photoresist 180. The "written" portions of photoresist 180 are then developed by rinsing in a solution that selectively removes the "written" portions, leaving openings in photoresist 180 extending to silicon nitride 140 to create a pattern.

Figure 3:
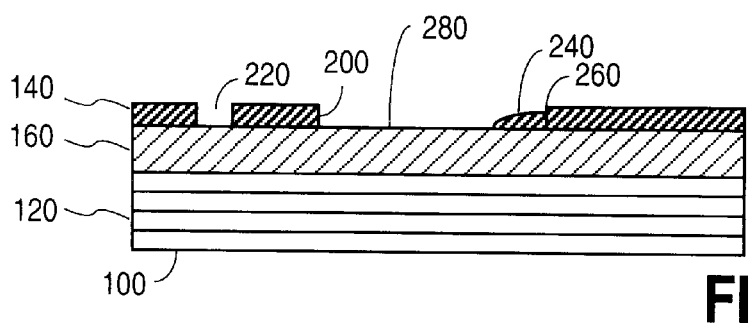
FIG. 3 represents a cross-sectional view of the mask of FIG. 2 after the pattern of the photoresist has been transferred to the first layer of defect-absorbing film and the photoresist has been removed. An example of an clear defect and an opaque defect are shown.

FIG. 3 is a cross-sectional view of the result of the next step, which is to etch silicon nitride first defect-absorbing material 140. FIG. 3 shows a freshly etched silicon nitride first defect-absorbing material 140 following photoresist 180 (FIG. 2) patterning and development. The silicon nitride first defect-absorbing material 140 is etched in a plasma using a combination of gases and other plasma conditions such as power and pressure, that etch silicon nitride 140 selectively relative to silicon dioxide second defect-absorbing material 160. A selective plasma etch results in substantially vertical silicon nitride sidewalls 200 with minimal etching into the underlayer silicon dioxide 160. As can be seen in FIG. 3, flaws from the previous photoresist patterning and development leave defects 220 and 240 in the etched silicon nitride 140. Clear defect 220 is usually caused by an overdeveloped photoresist, where areas of photoresist that are not intended to be opened by development are opened, creating micro-patterns (not shown) over silicon nitride 140. During plasma etch, the micro-patterns transfer to the silicon nitride 140 resulting in clear defect 220.

Opaque defect 240 in this example is caused by an underdeveloped photoresist, where areas of photoresist especially at pattern edges 260, that should be developed are not developed, creating micro-masks (not shown) over silicon nitride 140. During plasma etch, the micro-masks shield the silicon nitride 140 from being etched. When these micro-masks occur near pattern edges 260, they create the effect of a piece of silicon nitride 140 "intruding" into the open area 280. Opaque defect 240 is repaired to avoid intrusion into the pattern in the subsequent etch step.

Figure 4:
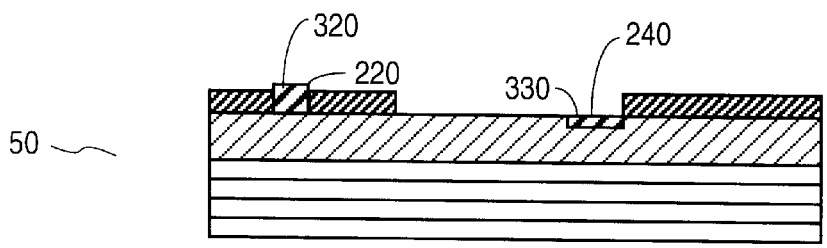
FIG. 4 represents a cross-sectional view of the mask of FIG. 3 after the defects have been repaired.

FIG. 4 is a cross-sectional view of mask 50 resulting from the following step, which is defect repair. During defect repair, a stream of ions, preferably gallium, literally hit the defective areas 220 and 240. The ion beam fills clear defect 220 (FIG. 3) with material to form a patch 320. The ion beam removes opaque defect 240 (FIG. 3) but leaves a stain 330.

Figure 5:
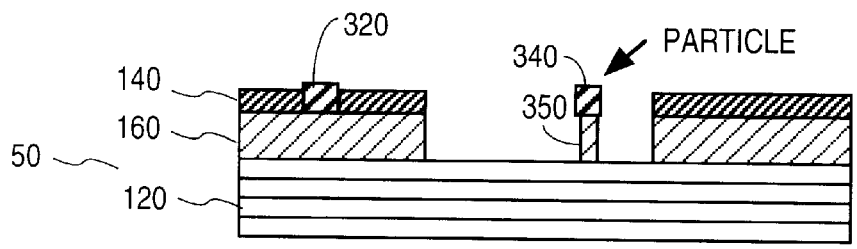
FIG. 5 represents a cross-sectional view of the mask of FIG. 4 after the pattern of the first layer of defect-absorbing film has been transferred to the second layer of defect-absorbing film. A particle creates a micro-mask in the etched opening.

FIG. 5 is a cross-sectional view of mask 50 following the next step of etching through the silicon dioxide second defect-absorbing material 160. A plasma is used to create vertical sidewalls in the silicon dioxide, utilizing the above silicon nitride 140 pattern as the mask. It can be seen that the repairs of clear 220 and opaque 240 defects (FIG. 3) were necessary to ensure that the intended pattern from patterned photoresist 180 (FIG. 2) transfers to the silicon nitride 140 and then transfers onward through silicon dioxide 160. The plasma etch process for silicon dioxide 160 uses a combination of gas chemistries, power and pressure to be selective to the underlayer 120, to minimize etching into underlayer 120.

During silicon dioxide 160 etch, a new defect 340 forms. Contamination particle defect 340 results from a contamination particle falling onto open area 280 (FIG. 3) during the etch step. A micro-mask is created from contamination defect 340, creating in turn a defect island 350, that is, a small structure of silicon dioxide 160 capped with contamination defect 340. Defect island 350 can be repaired in a second repair step.

Figure 6:
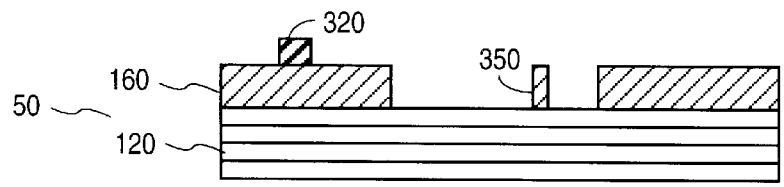
FIG. 6 represents a cross-sectional view of the mask of FIG. 5 after the first layer of defect-absorbing film has been removed.

FIG. 6 is a cross-sectional view of mask 50 resulting from the next step of selectively removing silicon nitride 140 (FIG. 5) first defect-absorbing material. This step is largely optional, and is done if the presence of silicon nitride 140 would interfere with a subsequent process step. Selective removal of silicon nitride 140 (FIG. 5) is preferably done by wet etching.

Figure 7:
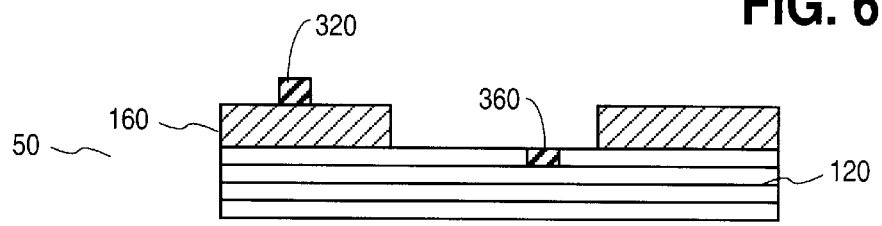
FIG. 7 represents a cross-sectional view of the mask of FIG. 6 following repair of the micro-mask.

FIG. 7 is a cross-sectional view of mask 50 resulting from the next step of repairing defect island 350 (FIG. 5). In a manner similar to that described above, defect island 350 (FIG. 5) is literally removed, leaving behind a stain 360. Baselayer stain 360 that remains from repair damage extends a small distance into underlayer resonant reflective substrate 120 due to the spreading effect of the repair damage. But because baselayer stain 360 is in a part of the mask that will not be reflecting light, and it will be covered in a subsequent step, the fact that stain 360 remains is immaterial to successful operation of the mask. Mask 50 now contains reflective resonant multilayer substrate 120 and a patterned silicon dioxide second defect-absorbing material 160. Mask 50 is now ready to receive absorber structures.

Figure 8:
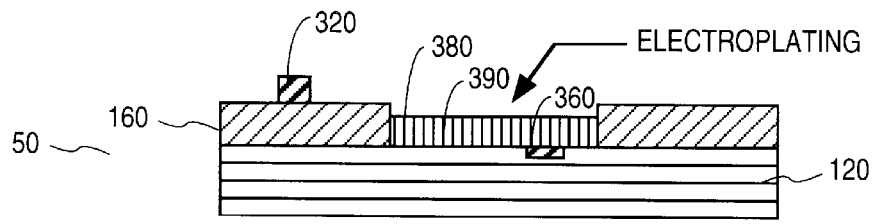
FIG. 8 represents a cross-sectional view of the mask of FIG. 7 including an electroplated absorbing layer embodiment of the invention.

FIG. 8 is a cross-sectional view of mask 50 resulting from the next step of filling silicon dioxide openings 380 with absorber 390. Absorber 390 is any material that substantially absorbs incoming light from the photolithography light source during mask 50 use. Preferably, absorber 390 is tungsten, although it can be aluminum, titanium or chromium or other material having the required light-absorbing characteristic. In this embodiment, absorber 390 is formed using electroplating. In electroplating, mask 50 is given an absorber "seed"; then is placed in an electrochemical bath that favors reducing absorber ion species into silicon dioxide opening 380, selectively to silicon dioxide layer 160. The amount of electroplating necessary is dependent on the desired thickness of absorber 390. Absorber 390 should be sufficiently thick that it acts substantially as an absorber 390 of light. Note that absorber 390 effectively covers baselayer stain 360 remaining from the second repair.

Figure 9:
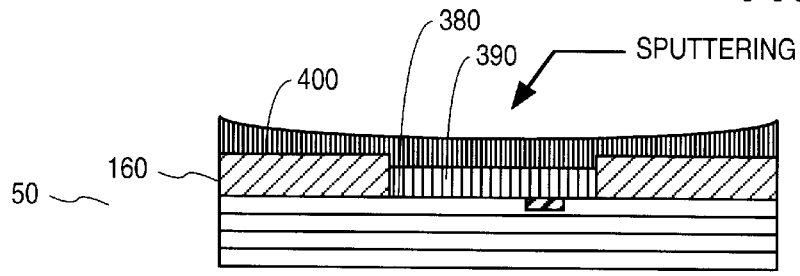
FIG. 9 represents a cross-sectional view of the mask of FIG. 7 including a sputtered absorbing layer embodiment of the invention.

FIG. 9 is a cross-sectional view of mask 50 using an alternative method of filling silicon dioxide opening 380. Instead of electroplating, which selectively fills openings, absorber 390 is sputtered into silicon dioxide opening 380 using blanket physical vapor deposition or chemical vapor deposition. With blanket deposition, absorber 390 fills silicon dioxide opening 380 and deposits over the top surface 400 of mask 50. Absorber 390 should be deposited to a pre-selected thickness sufficient to substantially absorb light from the photolithography light source during use of mask 50.

Figure 10:
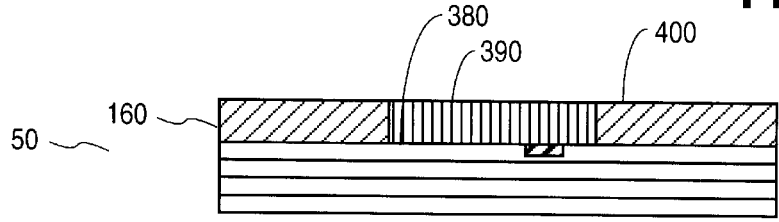
FIG. 10 represents a cross-sectional view of the mask of FIG. 8 following planarization of the mask top surface.

FIG. 10 is a cross-sectional view of mask 50 resulting from the next step after vapor depositing absorber 390, which is to planarize the top surface 400 of mask. Planarization is done using chemical mechanical polishing or etch back or other suitable technique. The effect of planarization is to smooth the remaining silicon dioxide 160 as well as to remove patch 320 (FIG. 5) to create a substantially planar top surface 400 by removing excess absorber 390 from the top of silicon dioxide 160. Planarization can also be done for the electroplating embodiment (FIG. 8) to planarize the mask top surface 400, although planarization may not be necessary.

Figure 11:
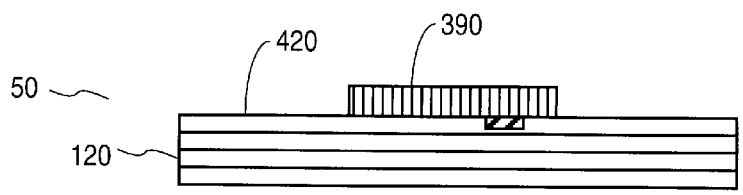
FIG. 11 represents a cross-sectional view of the mask of FIG. 10 in an alternative embodiment of the invention, where the surrounding second layer of defect-absorbing material is selectively removed.

FIG. 11 is a cross-sectional view of mask 50 resulting from the next step after the steps depicted in FIG. 8 or FIGS. 9 and 10. Silicon dioxide 160 (FIG. 10) is selectively removed from reflective resonant substrate 120. This is done preferably using wet chemical etching, to ensure silicon dioxide 160 (FIG. 10) is removed completely with minimal residue on reflective top surface 420. Silicon dioxide 160 (FIG. 10) needs to be removed for this embodiment because it absorbs light at EUVL wavelengths. Absorber 390 remains and blocks light applied to mask 50, and the exposed reflective resonant substrate 120 reflects light applied to mask 50. Note that the second defect-absorbing layer does not need to be silicon dioxide. If a transmissive material were used for the second defect-absorbing layer, this step of removing the layer would be unnecessary.

Figure 12:
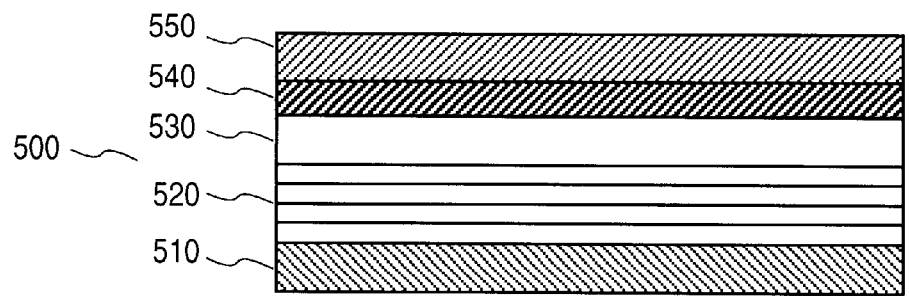
FIG. 12 represents a cross-sectional view of a starting mask in an alternative embodiment of the invention including a multilayer resonant reflective substrate having two defect-absorbing layers coated with photoresist.

FIGS. 12–20 illustrate another embodiment of the invention, utilizing a similar dual-layer defect-absorbing structure as described above. FIG. 12 is a cross-sectional view of a starting mask 500. In any embodiment of the invention, mask 500 can be formed on a substrate 510, and for this embodiment substrate 510 is preferably a silicon wafer for its ease of handling for fabrication processes and for its transmissive properties relative to EUVL wavelengths. Multilayer resonant reflective structure 520 is formed on silicon substrate 510. Resonant reflective structure 520 is preferably a series of alternating thin films of a transmissive material and reflective material similar to that described above, selected in accordance with the wavelength of light to be used in the photolithography. The silicon and molybdenum material example described above is suitable for EUVL and for this embodiment. Preferably, the reflective structure 520 is approximately 1,000 to 3,000 angstroms in thickness. Directly above resonant reflective structure 520 is a transmissive defect-absorbing layer 530. If silicon is the transmissive material within resonant reflective structure 520, then transmissive defect-absorbing layer 530 is preferably also silicon. While it is not required for transmissive defect-absorbing layer 530 to be the same material as that in resonant reflective structure 520, the materials must be etch compatible, in that they must both be etchable using plasma in a later process step. Silicon defect-absorbing layer 530 is preferably sputtered onto resonant eflective structure 520 to create a planar and substantially uniform thin layer of film. The thickness should be sufficiently thick to absorb inevitable process defects, but should be optimized to be as thin as possible. A thickness of approximately 500 angstroms is preferred.

Directly above silicon defect-absorbing layer 530 is silicon nitride defect-absorbing layer 540. Note that silicon nitride defect-absorbing layer 540 does not need to be made of silicon nitride; any material that can absorb process defects and be repaired and be selectively plasma etched to stop on the underlying material will do. Silicon nitride is the preferred material where the underlayer is silcon. Silicon nitride defect-absorbing layer 540 is deposited over silicon defect-absorbing layer 530 preferably by sputtering or chemical vapor deposition. The thickness should be sufficiently thick to serve as a mask for the underlying material, but should be optimized to be as thin as possible. Photoresist 550 coats silicon nitride defect-absorbing layer 540.

Figure 13:
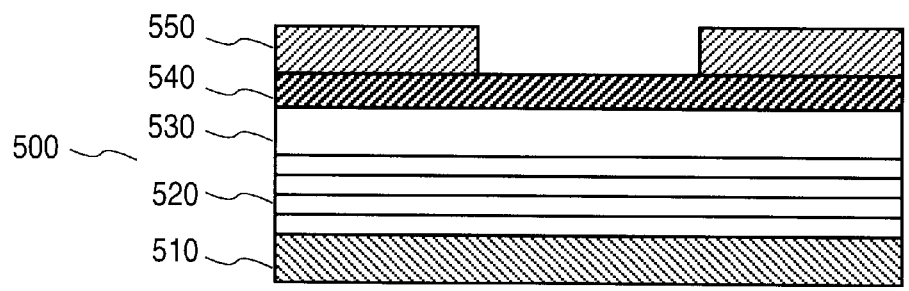
FIG. 13 represents a cross-sectional view of the mask of FIG. 12 after the photoresist has been patterned.

FIG. 13 is a cross-sectional view of the first step from the starting point illustrated in FIG. 12, which is to pattern the photoresist 550. As described above, photoresist 550 is preferably patterned by first applying an electron beam electronically controlled to "write" the desired pattern on the surface of photoresist 550. Photoresist 550 is then developed by rinsing in a chemical solution, and portions are washed away leaving openings 560 extending through the thickness of photoresist 550 to form a pattern.

Figure 14:
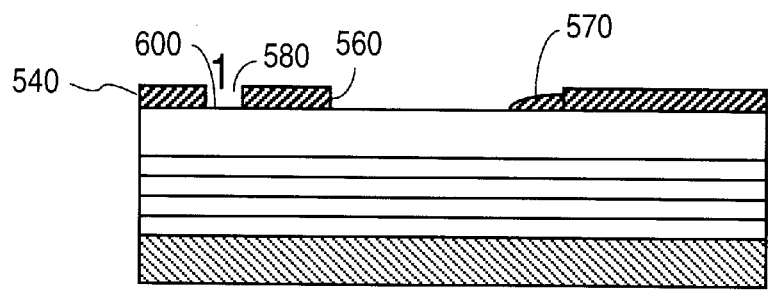
FIG. 14 represents a cross-sectional view of the mask of FIG. 13 following pattern transfer of the photoresist into the first layer of defect-absorbing material. An example of an clear defect and an opaque defect are shown.

FIG. 14 is a cross-sectional view of the result following the next step, which is to etch silicon nitride 540. Etching is preferably done using a plasma to ensure direct pattern transfer from photoresist 550 (FIG. 13) to silicon nitride 540. Photoresist 550 (FIG. 13) is removed from the top surface 560 of silicon nitride 540. Defects 570 and 580 remain from the etch process. Opaque defect 570 in this embodiment results from incomplete patterning of photoresist 550 (FIG. 13). Clear defect 580 in this embodiment results from excessive patterning of photoresist 550 (FIG. 13), in places where photoresist 550 (FIG. 13) is not supposed to be patterned. Opaque defect 570 leaves unetched silicon nitride 540 remaining where it should have been etched. Clear defect 580 removes silicon nitride 540 where it should not have been removed.

Figure 15:
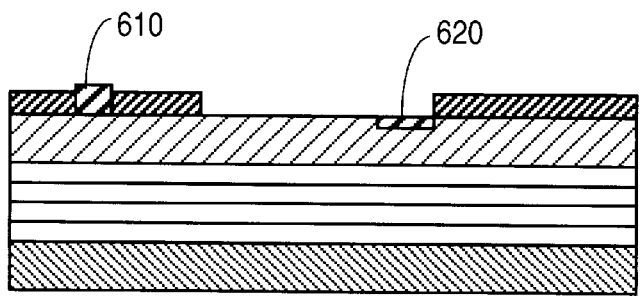
FIG. 15 represents a cross-sectional view of the mask of FIG. 14 following defect repair.

FIG. 15 is a cross-sectional view of the result following the next step, which is defect repair. An ion beam, preferably made of gallium, is applied to the defects to remove opaque defect 570 (FIG. 14) and fill clear defect 580 (FIG. 14) to create a patch 610. What remains after defect repair are patch 610 and stain 620. Because of the spreading effect of repair material or repair damage, patch 610 and stain 620 intrude into the underlying film.

Figure 16:
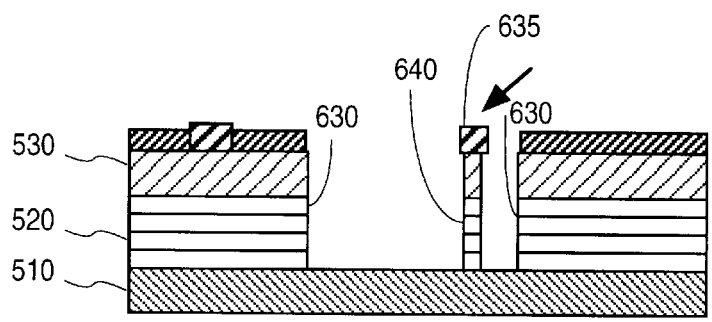
FIG. 16 represents a cross-sectional view of the mask of FIG. 15 following etching to transfer the pattern of the first layer of defect-absorbing material through the second layer of defect-absorbing material and through the multilayer resonant reflective substrate. An example of a micro-masking effect due to a contamination particle is shown.

FIG. 16 is a cross-sectional view of the result following the next step, which is different from the previous embodiment. In this step, both silicon defect-absorbing layer 530 and multilayer reflective layer 520 are plasma etched through the entire thickness of multilayer reflective layer 520 to the underlying substrate 510, preferably silicon wafer. Preferably, the plasma etch step is done as a single step, using etch conditions that etch both silicon defect-absorbing layer 530 and multilayer reflective layer 520, so that as soon as silicon defect-absorbing layer 530 is etched the plasma immediately begins etching multilayer reflective layer 520. Plasma etch conditions are selected to ensure smooth, straight sidewalls 630, and a clean etch free of residue. Unfortunately, a common occurrence in plasma etching is new defects. As shown in FIG. 16, a new defect has formed during this etch step. Contamination particle defect 635 has the effect of creating micro-mask to form an island 640 of unetched multilayer reflective layer 520.

Figure 17:
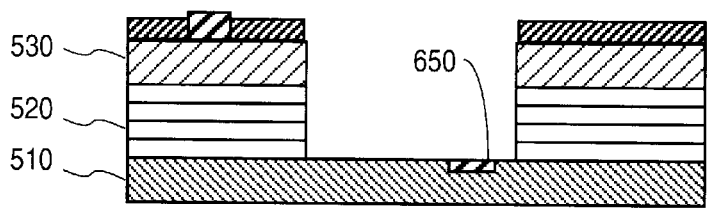
FIG. 17 represents a cross-sectional view of the mask of FIG. 16 following defect repair.

FIG. 17 is a cross-sectional view of the result following the next step, which is defect repair. In a manner similar to that described above, island 640 (FIG. 16) is removed, leaving a baselayer stain 650 in silicon substrate 510. As was in the case of the previous example, it is not a problem to have baselayer stain 650 remaining since it is not in the reflector area of the mask.

Figure 18:
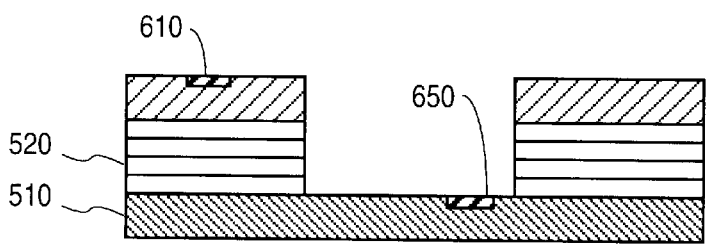
FIG. 18 represents a cross-sectional view of the mask of FIG. 17 following an optional step of selectively removing the first layer of defect-absorbing material.

FIG. 18 is a cross-sectional view of the result following the next step, which is to selectively remove silicon nitride 540 (FIG. 17). Silicon nitride 540 must be removed if it would otherwise negatively impact reflector 520 reflectivity. While eventually silicon nitride 540 (FIG. 17) is preferably removed, removal does not have to be done at this step. For example, silicon nitride 540 (FIG. 17) can be removed during a subsequent planarization step if the planarization process is compatible for silicon nitride 540 (FIG. 17) and any other material that must be removed. If silicon nitride 540 (FIG. 17) is removed separately, then it is done preferably using a wet chemical etch so that only silicon nitride 540 (FIG. 17) is removed and the underlying silicon defect-absorbing material 530 and silicon substrate 510 are clean and free of residue. Note that clear defect patch 610 remains in silicon defect-absorbing material 530.

Figure 19:
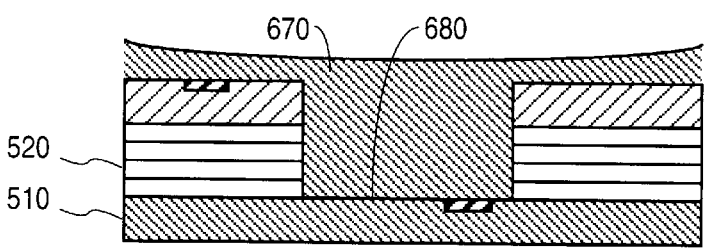
FIG. 19 represents a cross-sectional view of the mask of FIG. 18 following deposition of an absorbing or transmissive material.

FIG. 19 is a cross-sectional view of the result following the next step, which is to deposit a non-reflecting material 670 into the opening 680 created in multilayer reflective layer 520. Non-reflecting material 670 is preferably amorphous silicon for EUVL wavelengths, but it can also be an absorber such as tungsten, aluminum, chromium, titanium or tantalum. Non-reflecting material 670 is blanket deposited using physical vapor deposition or chemical vapor deposition. When blanket deposited, non-reflecting material 670 fills opening 680 and deposits on top of multilayer reflective layer 520.

Figure 20:
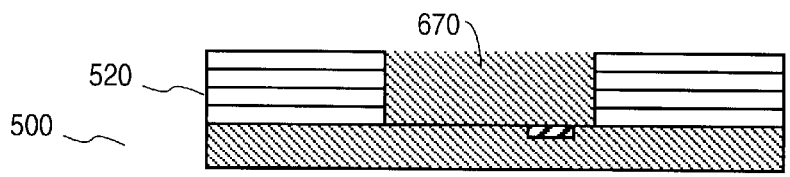
FIG. 20 represents a cross-sectional view of the mask of FIG. 19 following planarization of the mask top surface.

FIG. 20 is a cross-sectional view of the result following the next step, which is to planarize and remove excess non-reflecting material 670. By preferably using chemical mechanical polish or plasma etch back, all of the non-reflecting material 670 above multilayer reflective layer 520 is removed, as well as at least a portion of silicon defect-absorbing layer 530 (FIG. 19) to remove defect stains and any excess thickness that may reduce the reflectivity of multilayer reflective layer 520. As a final step, mask 500 is rinsed in a cleaning solution to ensure cleanliness after processing.

When in use, light from the photolithographic light source is applied to the mask. If it is a reflective mask, the light applied to reflective portions reflect and the light applied to transmissive or absorbing portions pass through or absorb the light. In a reflective mask embodiment or other embodiments of the final mask structure, the mask is fabricated using dual defect-absorbing layers to ensure that, through two steps of repair, the repair stains are eliminated on that section of the mask which must cleanly reflect light in the case of a reflective mask, or transmit light in the case of a transmissive mask.

The invention has been described in reference to preferred embodiments, but it should not be construed to be limited to the preferred embodiments in any way. For example, the invention was set forth as for EUVL to create a convenient context to help explain the details of the basic invention, but the invention is applicable to other photolithography wavelengths and the implementation of the details would need to be adjusted accordingly for a different wavelength photolithography mask. It will be appreciated by those of ordinary skill in the art that modification and derivatives of the embodiments can be made without departing from the scope of the invention, which is captured in the claims below.

I claim:

1. A method of fabricating a photolithographic mask, comprising:

forming a first defect-absorbing layer over a second defect-absorbing layer;

etching the first defect-absorbing layer to expose an underlying portion of the second defect-absorbing layer;

repairing defects in the etched first defect-absorbing layer;

etching the exposed portion of the second defect-absorbing layer to expose an underlying portion of a substrate;

repairing defects in the etched second defect-absorbing layer; and forming an absorbing layer on the exposed portion of the substrate.

2. A method as in claim 1, wherein the first defect-absorbing layer is silicon nitride.

3. A method as in claim 1, wherein the second defect-absorbing layer is silicon dioxide.

4. A method as in claim 1, wherein the step of forming an absorbing layer further includes electroplating absorbing material on the exposed portion of the substrate.

5. A method as in claim 4, further including the step of removing the remaining portions of the first defect-absorbing layer.

6. A method as in claim 5, further including the step of removing the remaining portions of the second defect-absorbing layer.

7. A method as in claim 1, wherein the step of forming an absorbing layer further includes blanket depositing absorbing material over the substrate and planarizing the deposited absorbing material.

8. A method as in claim 7, further including the step of removing the remaining portions of the first defect-absorbing layer.

9. A method as in claim 8, further including the step of removing the remaining portions of the second defect-absorbing layer.

10. A method as in claim 1, further including the step of forming a multilayer reflective coating on the substrate.

11. A method as in claim 1, wherein the steps of etching the first and second defect-absorbing layers includes using plasma etching.

12. A method of fabricating a photolithographic mask, comprising:

forming first and second defect-absorbing layers on a reflective material formed on a substrate;

etching the first defect-absorbing layer to expose an underlying portion of the second defect-absorbing layer;

repairing defects in the etched first defect-absorbing layer;

etching the reflective material and the second defect-absorbing layer using at least the first defect-absorbing layer as a mask to expose the substrate;

repairing defects in the etched reflective layer;

filling openings etched into the reflective material with a non-reflecting material; and planarizing the top surface of the mask.

13. A method as in claim 12, wherein the second defect-absorbing layer comprises a transmissive material layer.

14. A method as in claim 12, wherein the first defect-absorbing material is silicon nitride.

15. A method as in claim 12, wherein the second defect-absorbing material is silicon dioxide.

16. A method as in claim 12, further including the step of selectively plasma etching the first defect-absorbing material relative to the second defect-absorbing material.

17. A method as in claim 12, wherein the step of etching the reflective material is done immediately after etching the first defect-absorbing material.

18. A method as in claim 12, wherein the reflective material comprises a multilayer resonant reflector.

19. A method as in claim 12, wherein the non-reflecting material is selected from the group consisting of silicon, tungsten, aluminum, chromium, titanium or tantalum.

* * * * *

UNITED STATES PATENT AND TRADEMARK OFFICE
CERTIFICATE OF CORRECTION

PATENT NO. : 5,935,737
DATED : August 10, 1999
INVENTOR(S) : Yan

It is certified that error appears in the above-identified patent and that said Letters Patent is hereby corrected as shown below:

Column 7,
Line 27, delete "eflective" and insert -- reflective --.

Signed and Sealed this

Thirteenth Day of May, 2003

JAMES E. ROGAN
*Director of the United States Patent and Trademark Office*